(12) United States Patent
An et al.

(10) Patent No.: US 8,791,026 B2
(45) Date of Patent: Jul. 29, 2014

(54) METHOD AND APPARATUS FOR TREATING SILICON SUBSTRATE

(75) Inventors: Kil Soo An, Seoul (KR); Seung Il Chang, Gyeonggi-do (KR)

(73) Assignee: MMTech Co., Ltd., Ansan-si (KR)

( * ) Notice: Subject to any disclaimer, the term of this patent is extended or adjusted under 35 U.S.C. 154(b) by 96 days.

(21) Appl. No.: 13/241,154

(22) Filed: Sep. 22, 2011

(65) Prior Publication Data

US 2012/0083131 A1    Apr. 5, 2012

(30) Foreign Application Priority Data

Oct. 1, 2010 (KR) .................. 10-2010-0095974
Oct. 1, 2010 (KR) .................. 10-2010-0095975
Oct. 1, 2010 (KR) .................. 10-2010-0095976
Feb. 8, 2011 (KR) .................. 10-2011-0011120

(51) Int. Cl.
| | |
|---|---|
| *H01L 21/306* | (2006.01) |
| *C23F 1/08* | (2006.01) |
| *H01L 21/67* | (2006.01) |
| *H01L 21/311* | (2006.01) |
| *H01L 21/02* | (2006.01) |

(52) U.S. Cl.
CPC ...... *H01L 21/6708* (2013.01); *H01L 21/31105* (2013.01); *H01L 21/02068* (2013.01)
USPC ............................ 438/734; 438/758; 438/770

(58) Field of Classification Search
CPC .................... H01L 21/6708; H01L 21/31105; H01L 21/02068
USPC .................. 438/734, 758, 770; 257/E21.228
See application file for complete search history.

(56) References Cited

U.S. PATENT DOCUMENTS

| | | | | |
|---|---|---|---|---|
| 5,904,574 A | * | 5/1999 | Nishijima | 438/758 |
| 6,967,130 B2 | * | 11/2005 | Chen et al. | 438/199 |
| 2004/0259341 A1 | | 12/2004 | Chen et al. | |

FOREIGN PATENT DOCUMENTS

| | | |
|---|---|---|
| CN | 101459066 | 6/2009 |
| CN | 101553916 | 10/2009 |
| JP | 5-025660 A | 2/1993 |

(Continued)

OTHER PUBLICATIONS

Office Action in Korean Patent Application No. 10-2010-0095976, dated Sep. 15, 2011.
Office Action in Korean Patent Application No. 10-2011-0011120, dated Jan. 17, 2012.
Office Action in Korean Patent Application No. 10-2010-0095974, dated Mar. 29, 2012.

(Continued)

*Primary Examiner* — Nadine Norton
*Assistant Examiner* — Mahmoud Dahimene
(74) *Attorney, Agent, or Firm* — Nixon Peabody LLP

(57) ABSTRACT

A method and an apparatus for treating a silicon substrate for effectively removing a silicon oxide film formed on a surface of a silicon film and improving surface uniformity of the silicon film. The method comprises providing a substrate including a silicon film; providing a first fluid, which is capable of etching a silicon oxide film, to a surface of the substrate in a first time band; providing a second fluid containing water to the surface of the substrate in a second time band, which is different from the first time band; and providing a third fluid, which is capable of etching the silicon oxide film, has different ingredients as compared to the first fluid, and has high etching ratio with respect to the silicon oxide film, to a surface of the substrate in a third time band, which is different from the first time band and the second time band.

6 Claims, 15 Drawing Sheets

(56) References Cited

FOREIGN PATENT DOCUMENTS

| | | |
|---|---|---|
| JP | 2003-297800 A | 10/2003 |
| JP | 2004-006618 A | 1/2004 |
| JP | 2004-281463 A | 10/2004 |
| JP | 2005-086181 A | 3/2005 |
| JP | 2005-228938 A | 8/2005 |
| JP | 2009-21617 | 1/2009 |
| JP | 2004 006618 | 9/2011 |
| KR | 10 2002 0032184 A | 5/2002 |
| KR | 2003-0053367 | 6/2003 |
| KR | 20-0357681 | 7/2004 |
| KR | 10-2009-0069980 | 7/2009 |
| TW | I239036 | 9/2005 |
| TW | I296131 | 4/2008 |
| TW | 201029050 | 8/2010 |

OTHER PUBLICATIONS

Office Action issued in KR 10-2010-0095975, dated Aug. 24, 2011 (w/transiation).

Notice of Allowance in Korean Patent Application No. 10-2010-0095976, dated Sep. 25, 2012 (partial translation).

Notice of Allowance in Korean Patent Application No. 10-2010-0095975, dated Oct. 29, 2012 (partial translation).

Office Action in Korean Patent Application No. 10-2010-0095974, dated Oct. 29, 2012.

Office Action in Taiwanese Application No. 100135065, dated Dec. 4, 2013.

Office Action in Chinese Application No. 201110303337.6, dated Dec. 19, 2013.

\* cited by examiner

US 8,791,026 B2

METHOD AND APPARATUS FOR TREATING SILICON SUBSTRATE

CROSS-REFERENCE TO RELATED PATENT APPLICATION

This application claims the benefits of Korean Patent Application No. 10-2010-0095974, filed on Oct. 1, 2010, Korean Patent Application No. 10-2010-0095975, filed on Oct. 1, 2010, Korean Patent Application No. 10-2010-0095976, filed on Oct. 1, 2010, and Korean Patent Application No. 10-2011-0011120, filed on Feb. 8, 2011, in the Korean Intellectual Property Office, the disclosures of which are incorporated herein in their entirety by reference.

BACKGROUND OF THE INVENTION

1. Field of the Invention

The present invention relates to a method and an apparatus for treating a silicon substrate.

2. Description of the Related Art

Silicon films are used in various electronic devices including semiconductor devices, such as a thin-film transistor used as a driving device in an organic light emitting display device or a liquid crystal display device.

However, a silicon oxide film is naturally formed on a surface of a silicon film.

Such a silicon oxide film formed on a surface of a silicon film may affect characteristics of an electronic device that is to be formed of the silicon film and may become a source of contaminations, such as particles, during a manufacturing process. Therefore, it is necessary to remove the silicon oxide film.

Furthermore, a silicon film, and more particularly, a poly-silicon film is formed by crystallizing an amorphous silicon film, such as ELA. Here, if surface uniformity of the poly-silicon film is insufficient, characteristics of an electronic device to be fabricated using the poly-silicon film are significantly affected. Therefore it is necessary to improve surface uniformity of the poly-silicon film.

SUMMARY OF THE INVENTION

The present invention provides a method and an apparatus for treating a silicon substrate for effectively removing a silicon oxide film formed on a surface of a silicon film and improving surface uniformity of the silicon film.

According to an aspect of the present invention, there is provided a method of treating a silicon substrate, the method including providing a substrate including a silicon film; providing a first fluid, which is capable of etching a silicon oxide film, to a surface of the substrate in a first time band; and providing a second fluid, which is capable of etching the silicon oxide film, has different ingredients as compared to the first fluid, and has high etching ratio with respect to the silicon oxide film, to a surface of the substrate in a second time band, which is different from the first time band.

The first fluid contains ozone solution.

The second fluid contains fluorine or ammonium fluoride solution.

The method further includes a third fluid containing water to the surface of the substrate in a third time band, which is different from the first time band and the second time band.

The third time band is arranged between the first time band and the second time band.

The substrate is arranged in parallel to the ground or is tilted with respect to the ground.

At least one of the first through third fluids is sequentially supplied from a first end of the surface of the silicon film to a second end of the surface of the silicon film.

The first through third time bands partially overlap each others.

The first through third time bands are arranged to have different start timings.

Fluid cutting air is provided to the surface of the substrate to remove at least one of the first through third fluids remaining on the surface of the substrate, and the fluid cutting air is provided to the surface of the substrate in a fourth time band, which is different from the first through third time bands and is arranged between at least two of the first through third time bands.

According to another aspect of the present invention, there is provided a silicon substrate treating apparatus including a supporting base for supporting a substrate including a silicon film; a fluid supplying unit, which provides a fluid for etching a silicon oxide film to a surface of the substrate; a water supplying unit, which provides water to the surface of the substrate; and a control unit, which is connected to the fluid supplying unit and the water supplying unit and controls the fluid supplying unit and the water supplying unit to respectively provide the fluid for etching the silicon oxide film and the water in different time bands.

The fluid supplying unit includes a first fluid supplying unit, which provides a first fluid, which is capable of etching a silicon oxide film, to a surface of the substrate and is connected to the control unit; and a second fluid supplying unit, which provides a second fluid, which is capable of etching the silicon oxide film, has different ingredients as compared to the first fluid, and has higher etching ratio with respect to the silicon oxide film than the first fluid, to a surface of the substrate and is connected to the control unit.

The control unit controls the fluid supplying unit to respectively provide the first fluid and the second fluid in different time bands.

The first fluid contains ozone solution.

The second fluid contains fluorine or ammonium fluoride solution.

The supporting base is arranged to adjust tilting of the substrate with respect to the ground.

The silicon substrate treating apparatus further includes a fluid cutting air supplying unit, which provides fluid cutting air to the surface of the substrate and is connected to the control unit, wherein the control unit turns on the fluid cutting air supplying unit and the first fluid supplying unit simultaneously or turns on the fluid cutting air supplying unit and the second fluid supplying unit simultaneously.

The air supplying unit includes an air nozzle unit which provides fluid cutting air to the surface of the substrate; an air driving unit which is connected to the air nozzle unit and drives the air nozzle unit; and an air tank which is connected to the air nozzle unit and supplies the fluid cutting air to the air nozzle unit.

The fluid supplying unit includes a fluid nozzle unit which provides the fluid for etching a silicon oxide film to the surface of the substrate; a fluid driving unit which is connected to the fluid nozzle unit and drives the fluid nozzle unit; and a fluid reservoir which is connected to the fluid nozzle unit and supplies the fluid to the fluid nozzle unit, and the water supplying unit includes a water nozzle unit which provides the water to the surface of the substrate; a water driving unit which is connected to the water nozzle unit and drives the water nozzle unit; and a water reservoir which is connected to the water nozzle unit and supplies the water to the water nozzle unit.

The fluid nozzle unit and the water nozzle unit are integrated to each other and selectively provide the fluid and the water to the surface of the substrate, and the fluid driving unit and the water driving unit are integrated to each other.

The fluid supplying unit or the water supplying unit includes a nozzle unit, which includes a first supplying tube in which the fluid or the water flow and a plurality of nozzles arranged in the lengthwise direction of the first supplying tube; and a reservoir, which is connected to the nozzle unit and supplies the fluid or the water to the nozzle unit.

The nozzle unit further includes a second supplying tube, which interconnects two opposite ends of the first supplying tube.

The nozzle includes a first opening and a second opening that are sequentially formed in a direction from the substrate, and the first opening is larger than the second opening.

The first opening has a circular or an elliptical shape.

Since such etchants and water may be provided in a same chamber, a silicon substrate treating apparatus according to the present invention may be configured more compactly.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining preferred embodiments of the invention with reference to the attached drawings.

Figure 1:
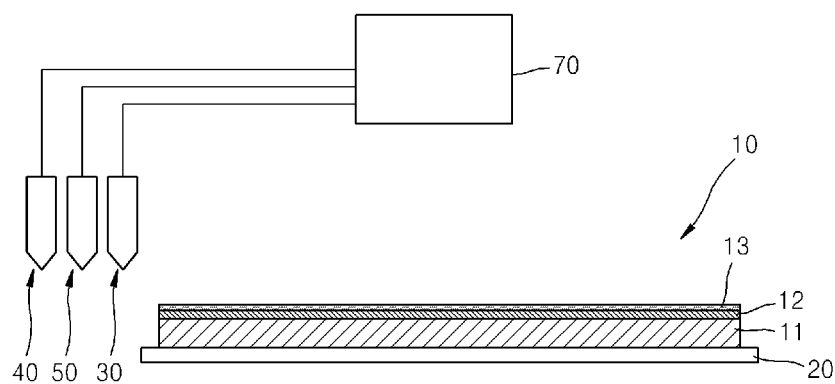
FIG. 1 is a schematic diagram showing configuration of a silicon substrate treating apparatus according to an embodiment of the present invention.

FIG. 1 is a schematic diagram showing configuration of a silicon substrate treating apparatus according to an embodiment of the present invention.

As shown in FIG. 1, the silicon substrate treating apparatus according to the present embodiment includes a supporting base 20, which supports a substrate 10, first through third fluid supplying units 50, and a control unit 70.

The substrate 10, which is prior to be processed according to the present invention, may be any of various types of substrates particularly used for display apparatuses and may include a base substrate 11, a silicon film 12, and a silicon oxide film 13.

The base substrate 11 may be a glass substrate, a plastic substrate, or a metal substrate. Although not shown, an insulation layer formed of an organic material and/or an inorganic material may be further arranged on a surface of the base substrate 11.

The silicon film 12 may be acquired by forming an amorphous silicon film on a surface of the base substrate 11. The silicon film 12 may become a poly-silicon film through a later crystallizing process. The crystallizing process may be a laser crystallizing process, such as ELA. However, the present invention is not limited thereto, and any of various types of crystallizing processes may be employed. The poly-silicon film acquired by crystallizing the silicon film 12 may be used as an active layer of a thin-film transistor of a display apparatus, for example. Here, the amorphous silicon film may also be used as an active layer of a thin-film transistor after being patterned and doped.

The silicon oxide film 13 is formed on a surface of the silicon film 12. The silicon oxide film 13 is a natural oxide film formed as the surface of the silicon film 12 is combined with oxygen or nitrogen in the air, where thickness of the silicon oxide film 13 is generally from about 5 Å to about 1,000 Å.

The substrate 10 is not limited to the base substrate 11 on which the silicon film 12 is formed as described above and may be any of various types of substrates including silicon films, such as a silicon wafer including a silicon film.

The supporting base 20 includes all units for supporting the substrate 10.

Although the supporting base 20 is shown as a table-like unit supporting the bottom surface of the substrate 10 in FIG. 1, the present invention is not limited thereto, and any of various structures may be applied as long as the substrate 10 may be supported and aligned. The supporting base 20 may be arranged to be relatively movable with respect to the first through third fluid supplying units 30 through 50 described below.

The first through third fluid supplying unit 30 through 50 are units for supplying first through third fluid to a surface of the substrate 10, and more particularly, for supplying the first through third fluid to a surface of the silicon oxide film 13 formed on a surface of the silicon film 12.

The first fluid supplying unit 30 is arranged to be connected to a separate first fluid reservoir (not shown) and to apply the first fluid to a surface of the substrate 10, where the first fluid supporting unit 30 may be arranged to be relatively movable with respect to the supporting base 20.

The second fluid supplying unit 40 is arranged to be connected to a separate second fluid reservoir (not shown) and to apply the second fluid to the surface of the substrate 10, where the second fluid supporting unit 40 may be arranged to be relatively movable with respect to the supporting base 20.

The third fluid supplying unit 50 is arranged to be connected to a separate third fluid reservoir (not shown) and to apply the third fluid to the surface of the substrate 10, where the third fluid supporting unit 50 may be arranged to be able to move relatively with respect to the supporting base 20

The first fluid contains a solution for etching the silicon oxide film 13 formed on a surface of the silicon film 12. According to an embodiment of the present invention, the first fluid may contain an ozone solution. The first fluid shows lower etching rate with respect to the silicon oxide film 13 as compared to the second fluid described below, and thus the first fluid may be used as a cleaning fluid for cleaning organic materials on a surface of the substrate. Therefore, the first fluid may be replaced with a neutral or an alkali cleaning fluid.

The second fluid may etch the silicon oxide film 13 formed on a surface of the silicon film 12, has different ingredients as compared to the first fluid, and contains a solution showing higher etching ratio with respect to the silicon oxide film 13. According to an embodiment of the present invention, the second fluid may contain fluorine or an ammonium fluoride solution.

Therefore, the first fluid supplying unit 30 and the second fluid supplying unit 40 may be also referred herein as fluid supplying units.

The third fluid is a fluid for diluting the first fluid and the second fluid on a surface of the substrate 10. According to an embodiment of the present invention, the third fluid may contain water, and the water may be a deionized water (DI water). The third fluid may function as a buffer fluid for stopping reactions of etchants, that is, the first fluid and the second fluid on a surface of the substrate 10.

The third fluid supplying unit 50 may also be referred herein as a water supplying unit.

The first through third fluid supplying unit 30 through 50 provide the first through third fluid, such that the first through third fluid uniformly spread throughout the substrate 10, where the first through third fluid supplying unit 30 through 50 may move relatively with respect to the supporting base 20 supporting the substrate 10. In other words, the supporting base 20 may move while the first through third fluid supplying unit 30 through 50 are fixed, or the first through third fluid supplying unit 30 through 50 may move while the supporting base 20 is fixed. In an embodiment of the present invention described below, it is assumed that the first through third fluid supplying unit 30 through 50 move while the supporting base 20 is fixed. Although FIG. 1 shows that the first through third fluid supplying units 30 through 50 are separate units, the present invention is not limited thereto, and the first through third fluid supplying units 30 through 50 may be connected to a single ejecting nozzle via separate vales and pipes to prevent the first through third fluids from being mixed with each other. Detailed description thereof will be given later.

Width of each of the first through third fluid supplying unit 30 through 50 may correspond to width of the substrate 10, and thus the first through third fluid may be provided throughout a surface of the substrate 10 in a single scanning However, the present invention is not limited thereto, the width of each of the first through third fluid supplying unit 30 through 50 may be smaller than the width of the substrate 10, so that the first through third fluids may be provided in a plurality of times of scanning Alternatively, the substrate 10 may be tilted with respect to a direction perpendicular to a direction in which the first through third fluid supplying unit 30 through 50 move, so that the first through third fluid may uniformly spread throughout a surface of the substrate 10 in a single scanning.

Furthermore, the first through third fluid supplying unit 30 through 50 may have any of various structures as long as the first through third fluids may be provided to a surface of the substrate 10.

For example, at least one of the first through third fluid supplying unit 30 through 50 may include a plurality of spraying nozzles and spray a fluid.

Furthermore, at least one of the first through third fluid supplying unit 30 through 50 may eject a fluid in the form of flowing fluid. Here, the fluid may be either ejected directly toward a surface of the substrate 10. Alternatively, the fluid may be ejected in a direction forming a predetermined angle with respect to a surface of the substrate 10, so that the fluid may flow and be dropped to the surface of the substrate 10.

The first through third fluid supplying unit 30 through 50 are connected to the control unit 70, and thus timings for the first through third fluid supplying unit 30 through 50 to eject fluids are controlled by the control unit 70. In other words, according to the present invention, the first through third fluid supplying unit 30 through 50 eject the first through third fluids at different supply initiation timings, that is, different time points, respectively.

The first through third fluid supplying unit 30 through 50 may be designed, such that movements of each of the first through third fluid supplying unit 30 through 50 are not interfered by each others. Therefore, the control unit 70 may easily change sequences of supplying the first through third fluids.

Although FIG. 1 shows that all of the first third fluid supplying units 30 through 50 are arranged, the present invention is not limited thereto. Although not shown, at least two of the first through third fluid supplying units 30 through 50 may be arranged.

Figure 2:
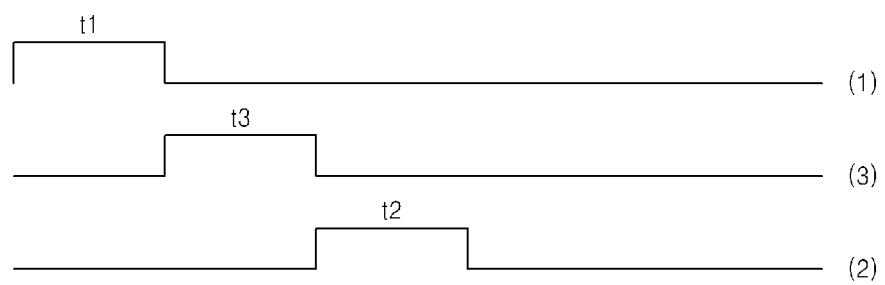
FIG. 2 is a timing diagram showing an example of first through third time bands controlled by a control unit shown in FIG. 1.

FIG. 2 shows an example of timings for ejecting the first through third fluid.

According to an embodiment of the present invention, as shown in FIG. 2, the third fluid 3 may be provided to the substrate 10 in a third time band t3 between a first time band t1 and a second time band t2.

In other words, as shown in FIG. 2, the third fluid 3 is provided to the substrate 10 after the first fluid 1 is provided and before the second fluid 2 is to be provided. Here, as the third fluid 3 is provided to the substrate 10, the first fluid 1 remaining on a surface of the substrate 10 may be cleaned by the third fluid 3, and thus a problem that it is unable to acquire a desired etching ratio due to mixing of the second fluid 2 with the remaining first fluid 1 may be eliminated. As a result, etching ratios may be accurately managed, and uniformity of quality may be improved in a mass-production process.

In FIG. 2, the start timing of the third time band t3 is identical to the end timing of the first time band t1, and the start timing of the second time band t2 is identical to the end timing of the third time band t3. However, the present invention is not limited thereto. Although not shown, the third fluid 3 may be provided in the third time band t3 a predetermined period of time after the first fluid 1 is provided in the first time band t1, for example. Furthermore, the second fluid 2 may be provided in the second time band t2 a predetermined period of time after the third fluid 3 is provided in the third time band t3.

Although FIG. 2 shows that the first through third time bands t1 through t3 have a same time width, time width of each of the first through third time bands t1 through t3 may be appropriately adjusted in consideration of reactions of the first through third fluid. Time width of each of the first through third time bands t1 through t3 may be adjusted with moving speeds of the first through third fluid supplying unit 30 through 50.

As shown in FIG. 2, if the first fluid 1 is provided to the substrate 10 first, organic materials on a surface of the silicon oxide film 13 shown in FIG. 1 may be washed and the silicon oxide film 13 may be partially etched at the same time. The first fluid 1 remains on the substrate 10 at least for the time width of the first time band t1 before the third fluid 3 is applied. Therefore, reaction due to the first fluid 1 may be controlled by controlling the time width of the first time band t1. Here, if there is a predetermined period of time between the first time band t1 and the third time band t3, reaction due to the first fluid 1 may be controlled in consideration of the predetermined period of time.

Next, the third fluid 3 is ejected to clean the first fluid 1 from a surface of the substrate 10, so that the first fluid 1 no longer reacts or reaction of the first fluid 1 is weakened.

Next, the strongest etchant, that is, the second fluid 2 is ejected to the substrate 10 to etch the silicon oxide film 13. By controlling a period of time for the second fluid 2 to remain on a surface of the substrate 10, the silicon oxide film 13 may be etched and a surface of the silicon film 12 may be partially etched simultaneously, and thus planarity of a surface of the silicon film 12 may be improved.

As described above, according to an embodiment of the present invention, the first fluid 1, third fluid 3, and the second fluid 2 are provided to the substrate 10 in the order stated, and thus the silicon oxide film 13 may be eliminated and planarity of a surface of the silicon film 12 may be improved. However, the sequence of providing the first through third fluids is not limited thereto, and the first through third fluids may be provided in any of various sequences. For example, only the first fluid 1 and third fluid 3 may be provided in different time bands, or only the second fluid 2 and the third fluid 3 may be provided in different time bands. Furthermore, the second fluid 2, third fluid 3, and the first fluid 1 may be provided to the substrate 10 in the order stated. However, the third fluid 3 may be provided before and after the etchants, that is, the first fluid 1 and the second fluid 2 are provided. Therefore, reaction times of the etchants, that is, the first fluid 1 and the second fluid 2 may be controlled by using the third fluid 3.

The first through third fluid supplying units 30 through 50 scans from the left to the right in FIG. 1 according to the timings shown in FIG. 2. However, the present invention is not limited thereto, and the first through third fluid supplying units 30 through 50 may reciprocate and scan as shown in FIG. 3.

Figure 3:
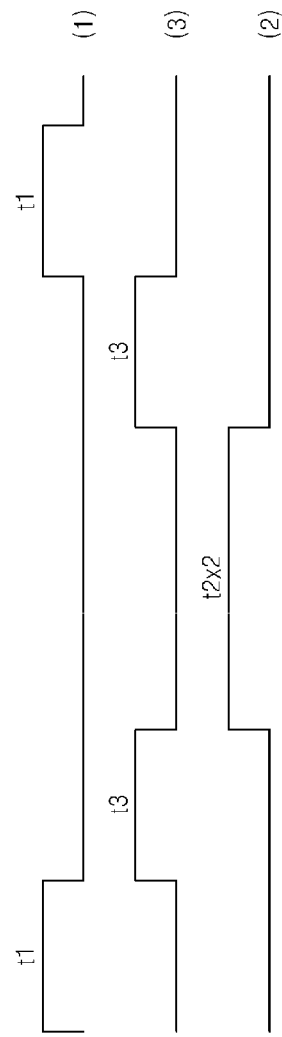
FIG. 3 is a timing diagram showing another example of first through third time bands controlled by a control unit shown in FIG. 1.

In other words, as shown in FIG. 3, after the first fluid 1 is first provided in the first time band t1, the third fluid 3 is provided in the third time band t3, and then the second fluid 2 is provided in a twice time of the second time band t2. Next, the third fluid 3 and the first fluid 1 are respectively provided in the third time band t3 and the first time band t1 in the order stated. Here, it is not necessary for the second fluid 2 to be the twice time of the second time band t2, and the second fluid 2 is provided in the second time band t2.

According to the present embodiment, the first through third fluids are provided to the substrate 10 in the order of the first fluid 1, the third fluid 3, the second fluid 2, the third fluid 3, and the first fluid 1. As a result, the silicon oxide film 13 may be removed and planarity of a surface of the silicon film 12 may be further improved. Furthermore, a surface of the substrate 10 may be more effectively cleaned. However, the sequence of providing the first through third fluids is not limited thereto, and the first through third fluids may be provided in any of various sequences. In other words, the first through third fluids may be provided to the substrate in the order of the second fluid 2, the third fluid 3, the first fluid 1, the third fluid 3, and the second fluid 2. Alternatively, the first through third fluids may be provided to the substrate in the order of the third fluid 3, the first fluid 1, the third fluid 3, the second fluid 2, the third fluid 3, the first fluid 1, and the third fluid 3. Alternatively, the first through third fluids may be provided to the substrate in the order of the third fluid 3, the second fluid 2, the third fluid 3, the first fluid 1, the third fluid 3, the second fluid 2, and the third fluid 3.

Figure 4:
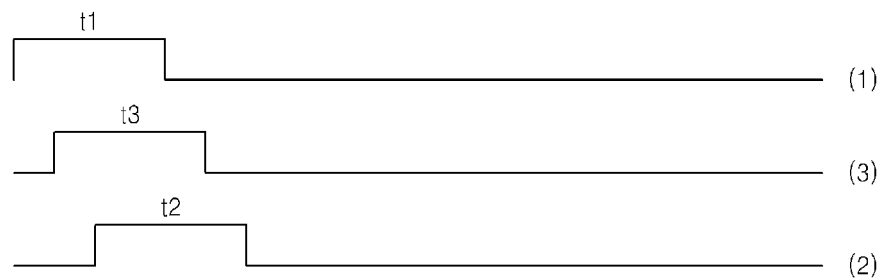
FIG. 4 is a timing diagram showing another example of first through third time bands controlled by a control unit shown in FIG. 1.

In the embodiment shown in FIG. 4, each of the first through third fluids 1 through 3 is ejected at a predetermined time interval before ejection of one of the other fluids is completed.

As described above, as the first through third time bands t1 through t3 overlap each others with different start timings, time widths of the first through third time band t1 through t3 may be identical to each other.

Figure 5:
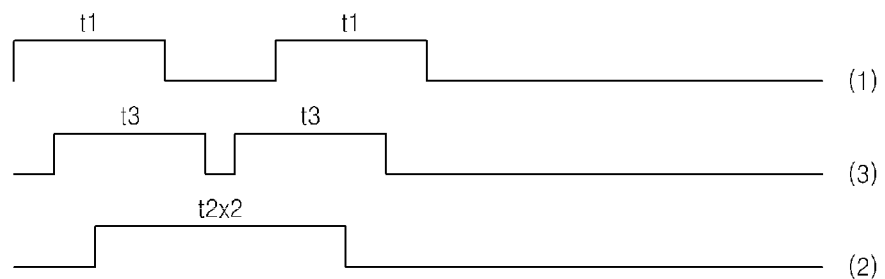
FIG. 5 is a timing diagram showing another example of first through third time bands controlled by a control unit shown in FIG. 1.

In the embodiment shown in FIG. 5, the first through third fluid supplying units 30 through 50 of the embodiment shown in FIG. 4 scan from the left to the right, and then scan from the right to the left.

As described above, by controlling start timings and time widths of the first through third time bands t1 through t3 in the embodiments shown in FIGS. 4 and 5, etching ratio of the silicon oxide film 13 and planarity of the silicon film 12 may be controlled. Furthermore, process speed may also be improved.

Figure 6:
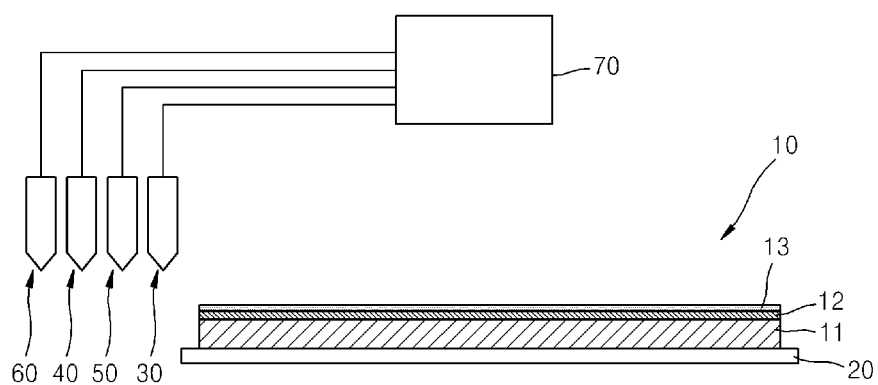
FIG. 6 is a schematic diagram showing configuration of a silicon substrate treating apparatus according to another embodiment of the present invention.

FIG. 6 shows a silicon substrate treating apparatus according to another embodiment of the present invention, which is the silicon substrate treating apparatus according to the embodiment shown in FIG. 1 further including an air supplying unit 60 connected to the control unit 70.

Same as the first through third fluid supplying unit 30 through 50, the air supplying unit 60 moves relatively with respect to the supporting base 20 and provides fluid cutting air to a surface of the substrate 10.

The fluid cutting air is for removing at least one of the first through third fluids that are provided to the substrate 10 in previous operations and remain by pushing the first through third fluids using air pressure. Therefore, the first through third fluids are not mixed with each others on a surface of the substrate 10, and thus undesired changes of concentrations of etchants, that is, the first fluid and the second fluid may be prevented. Therefore, etching speeds of the first fluid and the second fluid may be precisely controlled by using the fluid cutting air, and buffering of the third fluid 3 may be easily controlled.

Although FIG. 6 shows that only one air supplying unit 60 is arranged, the present invention is not limited thereto. According to mechanism design conditions, any of various numbers of the air supplying units 60 may be arranged, so that at least two of the first through third fluids are not mixed with each other. Furthermore, operation of the air supplying unit 60 does not interfere operations of the first through third fluid supplying units 30 through 50, and thus freedom of sequences of operating the air supplying unit 60 may be guaranteed.

Figure 7:
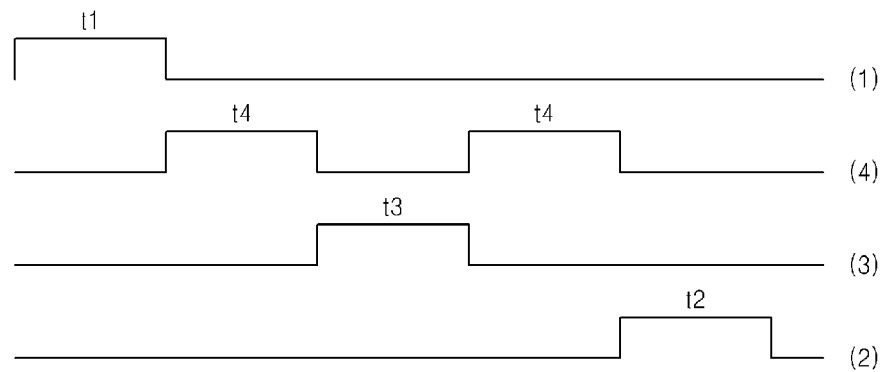
FIG. 7 is a timing diagram showing an example of first through fourth time bands controlled by a control unit shown in FIG. 6.

As shown in FIG. 7, the fluid cutting air 4 is provided to a surface of the substrate 10 in a fourth time band t4, which is different from the first through third time bands t1 through t3, where the fourth time band t4 is arranged between at least two of the first through third time bands t1 through t3. In FIG. 7, the fourth time band t4 is arranged between the first time band t1 and the third time band t3 and between the third time band t3 and the second time band t2. However, the present invention is not limited thereto, and the fourth time band t4 may be arranged either between the first time band t1 and the third time band t3 or between the third time band t3 and the second time band t2 only. Furthermore, it is not necessary for the start timing of the fourth time band t4 to be the end timing of the first time band t1 or the end timing of the third time band t3, and the fourth time band t4 may start a predetermined time after the first time band t1 or the third time band t3.

FIG. 7 shows that the fourth time band t4 for providing the fluid cutting air 4 is applied to the embodiment shown in FIG. 2. Although not shown, the time band t4 for providing the fluid cutting air 4 may also be applied to the embodiment shown in FIG. 3. In this case, the fourth time band t4 may be arranged between at least two of the first through third time bands t1 through t3.

Figure 8:
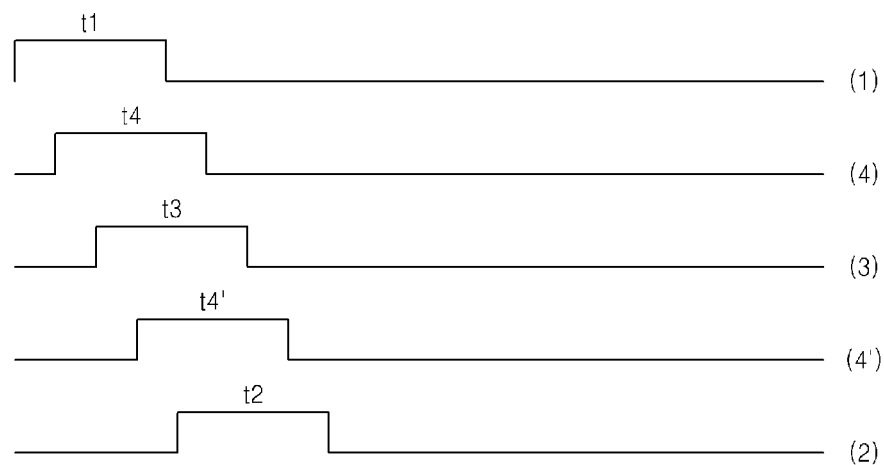
FIG. 8 is a timing diagram showing another example of first through fourth time bands controlled by a control unit shown in FIG. 6.

FIG. 8 shows that the fourth time band t4' for providing the fluid cutting air 4 and 4' is applied to the embodiment shown in FIG. 4. In this case, the fourth time band t4 is arranged between the first time band t1 and third time band t3, whereas the fourth time band t4' is arranged between the third time band t3 and the second time band t2. According to system design conditions, only one of the fourth time band t4 and the fourth time band t4' may be arranged.

Figure 9:
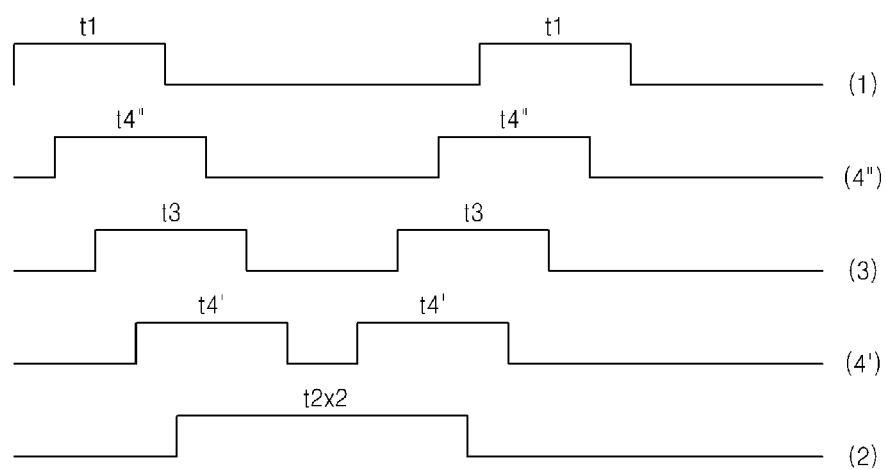
FIG. 9 is a timing diagram showing another example of first through fourth time bands controlled by a control unit shown in FIG. 6.

FIG. 9 shows that the fourth time bands t4 and t4' are respectively arranged between the first time band t1 and the third time band t3 and between the third time band t3 and the second time band t2, shown in FIG. 5. In the embodiment shown in FIG. 9, after the first fluid 1 is supplied, the fluid cutting air 4', the third fluid 3, the fluid cutting air 4', and the second fluid 2 are successively supplied in the order stated. Next, the first fluid 1, the fluid cutting air 4', the third fluid 3, the fluid cutting air 4', and the second fluid 2 are supplied in the reverse order.

Figure 10:
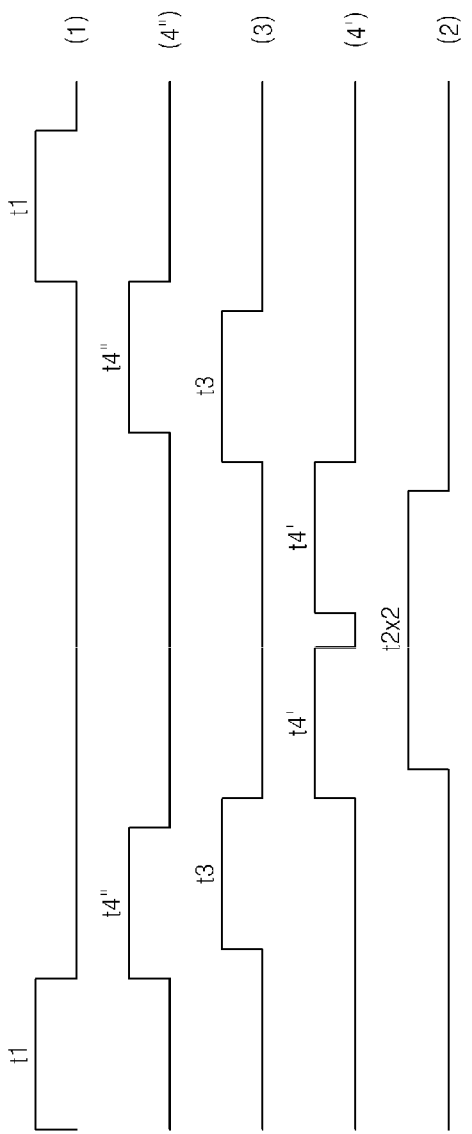
FIG. 10 is a timing diagram showing another example of first through fourth time bands controlled by a control unit shown in FIG. 6.

FIG. 10 shows timings for supplying fluid cutting air 4" and 4' according to another embodiment of the present invention. First, after the first time band t1 is over, the fourth time band t4" and the third time band t3 start. Furthermore, after the first third time band t3 is over, the fourth time band t4' and the second time band t2 start. The sequence may be reversed when the first through third fluid supplying units 30 through 50 and the air supplying unit 60 return.

FIGS. 9 and 10 show examples in which the first through third fluid supplying units 30 through 50 and the air supplying unit 60 reciprocate. However, the embodiments may also be applied to a case in which the first through third fluid supplying units 30 through 50 and the air supplying unit 60 move in a single direction.

The timing diagrams described above show periods of time during which the first through third fluids 1 through 3 and the fluid cutting air 4 are supplied to the substrate 10. Therefore, in FIGS. 4 and 5, since the first through third fluids 1 through 3 sequentially contact the substrate 10, the first through third fluid supplying units 30 through 50 may be simultaneously turned on in actual operation, so that the first through third fluids 1 through 3 are sequentially provided to the substrate 10. Furthermore, in FIGS. 8 through 10, the air supplying unit 60 which supplies the fluid cutting air 4, 4', and 4" may be simultaneously turned on with the first fluid supplying unit 30 and/or the second fluid supplying unit 40 and/or the third fluid supplying unit 50, so that the fluid cutting air 4, 4', and 4" may be supplied to the substrate 10.

Figure 11:
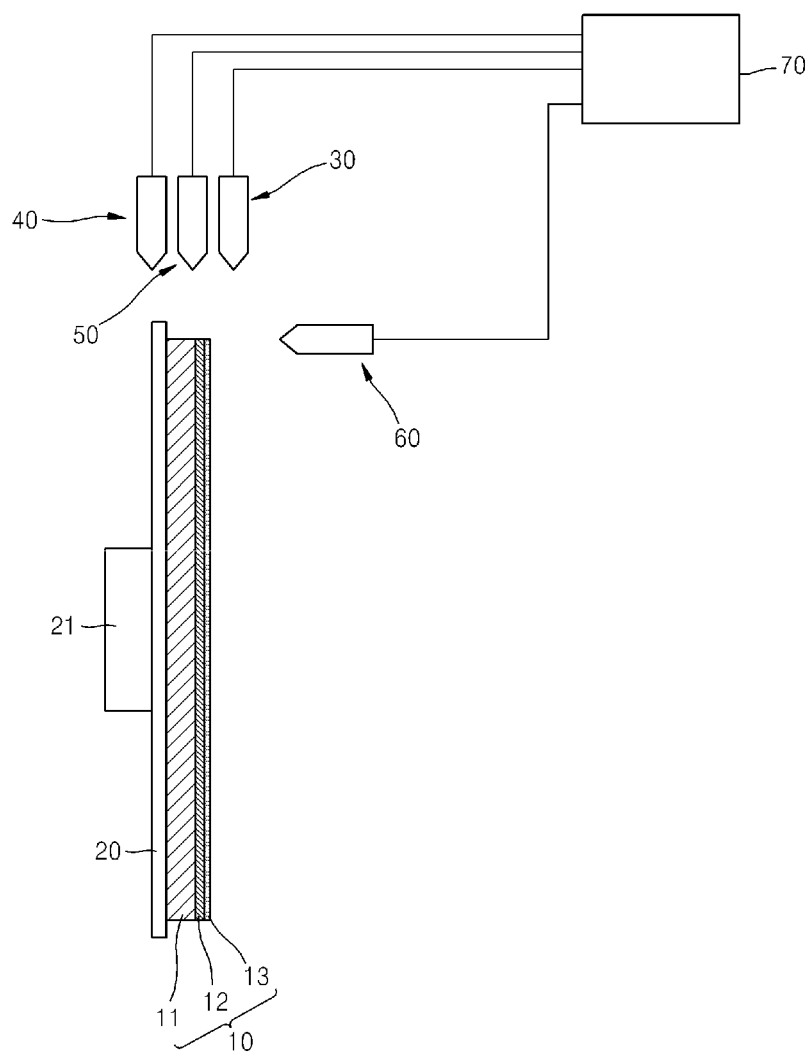
FIG. 11 is a schematic diagram showing configuration of a silicon substrate treating apparatus according to another embodiment of the present invention.

In the embodiments described above, the substrate 10 is arranged in parallel to the ground. However, the present invention is not limited thereto. As shown in FIG. 11, a separate tilting unit 21 may be arranged at the supporting base 20, and thus the substrate 10 may be tilted with respect to the ground. The tilting unit 21 may rotate the supporting base 20, so that the substrate 10 is arranged vertical to the ground as shown in FIG. 11. Alternatively, although not shown, the tilting unit 21 may rotate the supporting base 20, so that the substrate 10 is tilted with respect to the ground and forms an acute angle with respect to the ground. Although the supporting base 20 has a table-like shape as described above, the present invention is not limited thereto, and the supporting base 20 any of various shapes as long as the substrate 10 may be titled and fixed.

In the embodiment shown in FIG. 11, the first through third fluid supplying units 30 through 50 may eject the first through third fluids, such that the first through third fluids flow from above the substrate 10 to a surface of the substrate 10, and more particularly, a surface of the silicon oxide film 13. Therefore, in this case, it is not necessary for the first through third fluid supplying units 30 through 50 to relatively move with respect to the supporting base 20.

Meanwhile, in the present embodiment, the air supplying unit 60 providing the fluid cutting air 4 may relatively move with respect to the supporting base 20 and may remove at least one of the first through third fluids on a surface of the substrate 10.

As shown in FIG. 11, in a case where a surface of the substrate 10 is tilted with respect to the ground, flux of the first through third fluids may be controlled, such that the first through third fluids uniformly spread through the surface of the substrate 10.

The silicon substrate treating apparatus as described above may be arranged in a single chamber, and thus the overall silicon substrate treating apparatus may be configured compactly.

Figure 12:
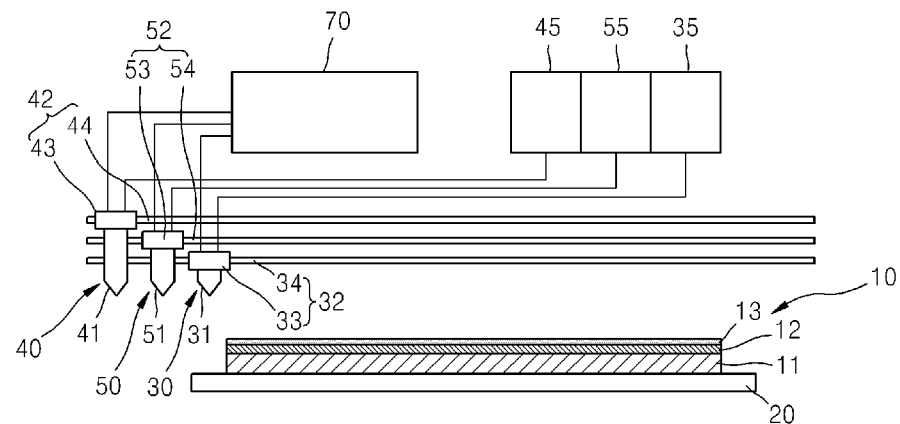
FIG. 12 is a schematic diagram showing configuration of a silicon substrate treating apparatus according to an embodiment of the present invention.

The silicon substrate treating apparatus as shown in FIG. 1 may be specified as shown in FIG. 12.

Figure 13:
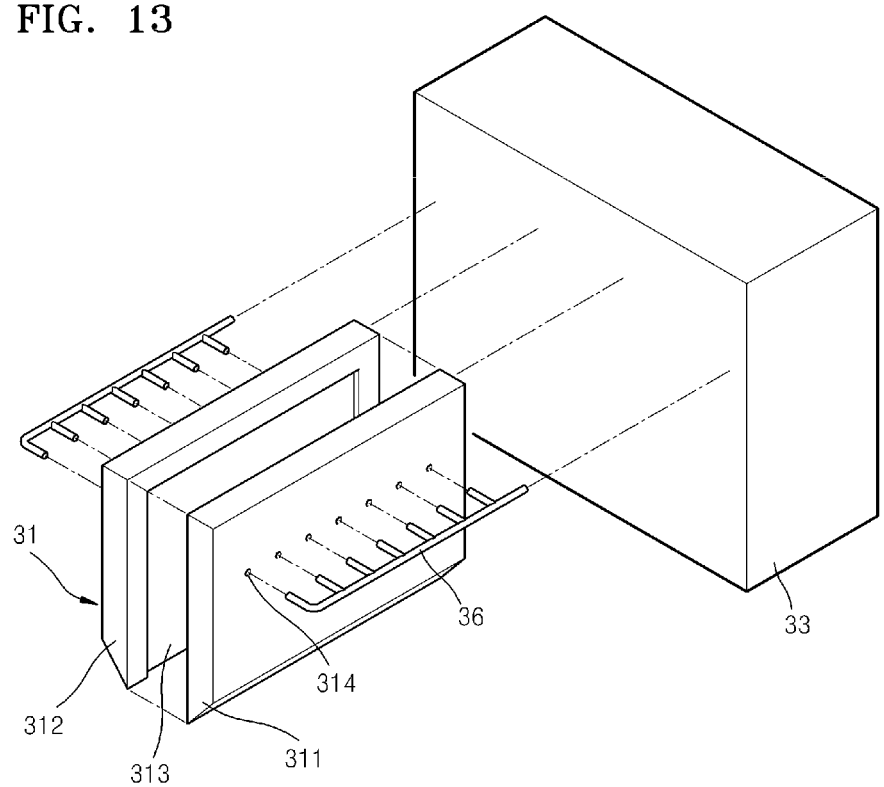
FIG. 13 is an exploded perspective view showing an example of a first fluid supplying unit shown in FIG. 12 in closer detail.

FIG. 12 is a schematic diagram showing configuration of a silicon substrate treating apparatus according to an embodiment of the present invention, and FIG. 13 is an exploded perspective view showing an example of the first fluid supplying unit 30 shown in FIG. 12 in closer detail.

The first fluid supplying unit 30 includes a first nozzle unit 31 and a first driving unit 32. The second fluid supplying unit 40 includes a second nozzle unit 41 and a second driving unit 42. The third fluid supplying unit 50 includes a third nozzle unit 51 and a third driving unit 52. The first nozzle unit 31 and the second nozzle unit 41 constitute a fluid nozzle unit stated in the claims, whereas the first driving unit 32 and the second driving unit 42 constitute a fluid driving unit stated in the claims. Furthermore, the third nozzle unit 51 and the third driving unit 52 constitute a water nozzle unit and a water driving unit stated in the claims, respectively.

The first through third driving unit 32 through 52 include first through third driving blocks 33 through 53 and first through third guides 34 through 54, respectively. The first through third guides 34 through 54 are arranged to extend in a direction along a surface of the substrate 10. The first through third driving blocks 33 through 53 are arranged to move in a single direction or reciprocate along the first through third guides 34 through 54, respectively. Here, the first through third driving blocks 33 through 53 and the first through third guides 34 through 54 may include linear motor units.

The first through third driving blocks 33 through 53 may be designed not only to move along the first through third guides 34 through 54, but also to intermittently supply the first through third fluids to the first through third nozzle unit 31 through 51. Here, opening/closing sides operated by the control unit 70 may be arranged in the first through third driving blocks 33 through 53, so that supplies of the first through third fluids from first through third reservoir 35 through 55 may be selectively blocked. Furthermore, a pump unit for stably supplying the first through third fluids to the first through third nozzle units 31 through 51 may be further arranged.

Figure 14:
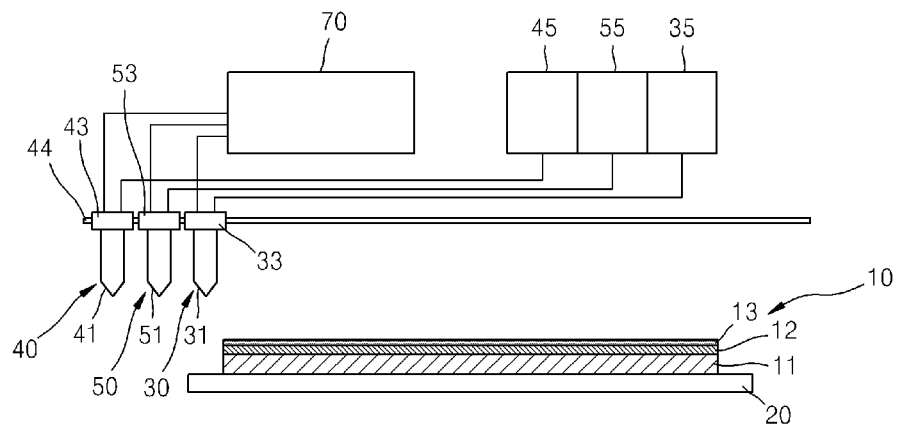
FIG. 14 is a schematic diagram showing configuration of a silicon substrate treating apparatus according to another embodiment of the present invention.

FIG. 12 shows that the first through third driving blocks 33 through 53 respectively move along separate guides. However, the present invention is not limited thereto, and, as shown in FIG. 14, all of the first through third driving blocks 33 through 53 may be connected to a guide, e.g., the second guide 44, and move along the second guide 44. Therefore, space limits of a silicon substrate treating apparatus may be further resolved. The embodiment may be applied to all of embodiments described below.

As shown in FIG. 13, the first nozzle unit 31 may be formed as a first nozzle block 311 and a second nozzle block 312 are combined with each other, where a space is formed therebetween to accommodate the first fluid therein. A plurality of penetration holes 314 are formed in the first nozzle block 311 and the second nozzle block 312, and a nozzle 313 is formed in a direction in which the first fluid is discharged. The nozzle 313 may be a single linear opening or a plurality of holes formed at a constant intervals. The nozzle 313 may be formed to face toward a surface of the substrate 10. However, the present invention is not limited thereto, and the nozzle 313 may be formed, such that a fluid may be ejected in a direction forming a predetermined angle with respect to a surface of the substrate 10, so that the fluid may flow and be dropped to the surface of the substrate 10.

A first end of the first connecting unit 36 is connected to the penetration hole 314 of the first nozzle unit 31, whereas a second end of the first connecting unit 36 is connected to the first driving block 33 and the opening/closing side of first driving block 33. The first connecting unit 36 may be arranged as a connecting tube.

Although FIG. 13 shows the first nozzle unit 31, the second nozzle unit 41 and the third nozzle unit 51 may be formed to have the same structure, and thus detailed descriptions thereof will be omitted.

The first through third reservoirs 35 through 55 respectively store the first through third fluids and may be respectively connected to the first through third driving blocks 33 through 53. However, the present invention is not limited thereto, and the first through third reservoirs 35 through 55 may be connected to the first through third driving blocks 33 through 53 via the control unit 70 or may be connected to the first through third driving blocks 33 through 53 via separate values and/or tubes.

Meanwhile, although not shown, widths of the first through third nozzles units 31 through 51 correspond to width of the substrate 10, and thus the first through third fluids may be provided throughout a surface of the substrate 10 in a single scanning However, the present invention is not limited thereto, and the width of each of the first through third nozzles unit 31 through 51 may be smaller than the width of the substrate 10, so that the first through third fluids may be provided in a plurality of times of scanning Alternatively, the substrate 10 may be tilted with respect to a direction perpendicular to a direction in which the first through third nozzles unit 31 through 51 move, so that the first through third fluid may uniformly spread throughout a surface of the substrate 10 in a single scanning.

The first through third driving units 32 through 52 are connected to the control unit 70, and thus the control unit 70 controls timings for ejecting the first through third fluids. In other words, according to the present invention, the first through third driving units 32 through 52 eject the first through third fluids in different time bands, respectively.

Although not clearly shown in FIG. 12, the first through third driving units 32 through 52 may be designed to not to interfere movements of each others. Therefore, the control unit 70 may easily change sequences of supplying the first through third fluids.

Meanwhile, the first nozzle unit 31 is not limited to the structure shown in FIG. 13 and may be a unit for spraying a fluid therein.

Figure 15:
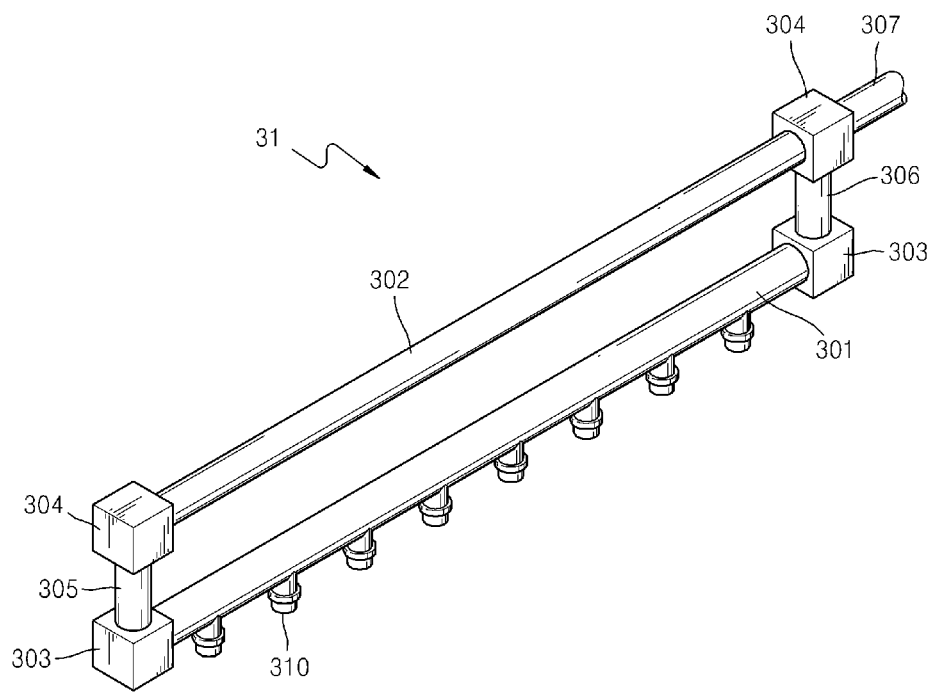
FIG. 15 is an exploded perspective view showing an example of a first nozzle unit shown in FIG. 12 in closer detail.

FIG. 15 is a partial perspective view showing an example of the first nozzle unit 30 in closer detail.

The first nozzle unit 30 according to the embodiment shown in FIG. 15 includes a first supplying tube 301 and a second supplying tube 302 which interconnects two opposite ends of the first supplying tube 301.

The first blocks 303 are connected to the two opposite ends of the first supplying tube 301. Furthermore, the second supplying tube 302 is arranged to have a length corresponding to that of the first supplying tube 301, and the second blocks 304 are connected to two opposite ends of the second supplying tube 302.

A third supplying tube interconnects the first blocks 303 connected to the two opposite ends of the first supplying tube 301 and the second blocks 304 connected to the two opposite ends of the second supplying tube 302, thus interconnecting the first supplying tube 301 and the second supplying tube 302. Furthermore, a fourth supplying tube 307 is connected to one of the second blocks 304 to supply a fluid. The fourth supplying tube 307 may also be connected to one of the first blocks 303. In FIG. 12, the fourth supplying tube 307 may be connected to the first driving block 33 and connected to an external reservoir (not shown).

As described above, as the two opposite ends of the first supplying tube 301 are connected to each other via the second supplying tube 302, a fluid may be supplied to the entire first supplying tube 301 in the lengthwise direction at relative uniformity, and thus deviations in amounts of fluids ejected by the nozzles 310 may be reduced. The nozzles 310 are arranged below the first supplying tube 301.

Figure 16A:
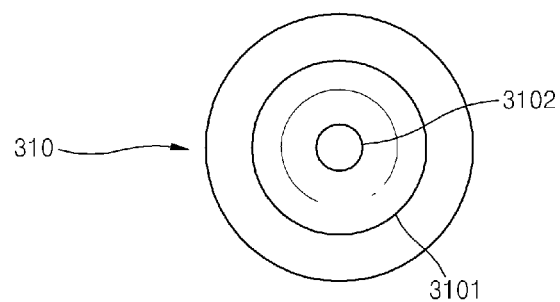
FIGS. 16A and 16B are bottom view and sectional view showing a nozzle shown in FIG. 15 according to an embodiment of the present invention.
Figure 16B:
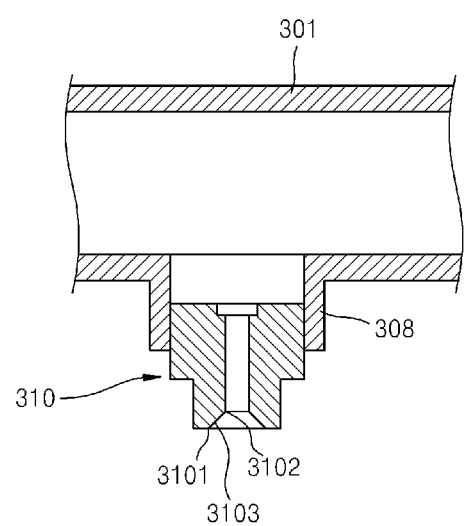

FIGS. 16A and 16B show the nozzle 310 according to an embodiment of the present invention.

The nozzle 310 includes a first opening 3101 and a second opening 3102, which are arranged in a direction toward the substrate (10, refer to FIG. 12) in the order stated. Here, the first opening 3101, which is arranged relatively close to the substrate 10, is larger than the second opening 3102. Both the first opening 3101 and the second opening 3102 have circular shapes, and a tilted surface 3103, which is tilted by a predetermined angle, is arranged between the first opening 3101 and the second opening 3102. Therefore, a fluid ejected by the nozzle 310 spreads outward while the fluid is being ejected from the first opening 3101 via the second opening 3102, and thus the fluid may be uniformly applied to a wide area. The nozzles 310 are respectively combined with ejection holes 308 formed in the first supplying tube 301.

Figure 17A:
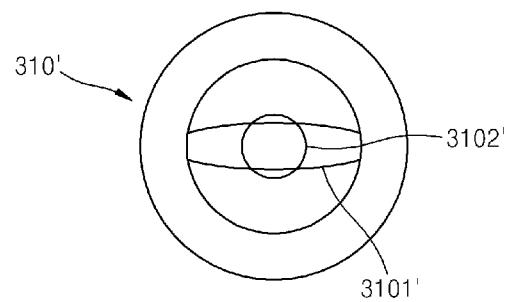
FIGS. 17A and 17B are bottom view and sectional view showing a nozzle shown in FIG. 15 according to another embodiment of the present invention.
Figure 17B:
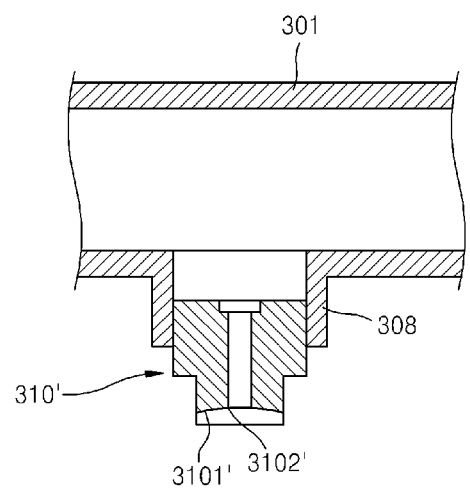

FIGS. 17A and 17B show a nozzle 310' according to another embodiment of the present invention.

The nozzle 310' also includes a first opening 3101' and a second opening 3102', which are arranged in a direction toward the substrate (10, refer to FIG. 12) in the order stated, and the first opening 3101', which is arranged relatively close to the substrate 10, is larger than the second opening 3102'. Here, the second opening 3102' has a substantially circular shape, whereas the first opening 3101' has an elliptical shape including the second opening 3102'. Therefore, a fluid ejected by the nozzle 310' spreads wider in a direction in which the first opening 3101' widens while the fluid is being ejected by the first opening 3101' via the second opening 3102', and thus the fluid is uniformly ejected to wider area. The longer radius-wise direction of the first opening 3101' may be identical to the width-wise direction of the substrate 10, which is perpendicular to a direction in which the substrate 10 extends, in FIG. 12. Therefore, a fluid may be uniformly ejected via the first opening 3101' through the width of the substrate 10.

Although the first nozzle unit 31 will be described with reference to FIGS. 15 through 17b, the second nozzle unit 41 and the third nozzle unit 51 may be formed to have the same structure, and thus detailed descriptions thereof will be omitted.

Furthermore, the first nozzle unit 31 described above with reference to FIG. 13 and the first nozzle unit 31 described above with reference to FIGS. 15 through 17b may be equally applied to all of embodiments described below.

Figure 18:
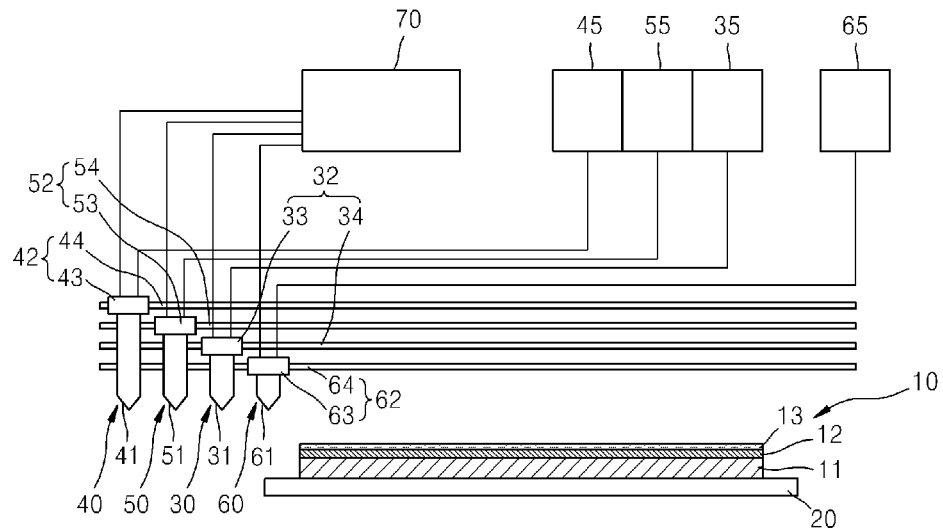
FIG. 18 is a schematic diagram showing configuration of a silicon substrate treating apparatus according to another embodiment of the present invention.

FIG. 18 is a diagram showing the embodiment shown in FIG. 6 in closer detail.

Referring to FIG. 18, the air supplying unit 60 is a unit for supplying fluid cutting air to a surface of the substrate 10 and includes a fourth nozzle unit 61 and a fourth driving unit 62. The fourth nozzle unit 61 and the fourth driving unit 62 correspond an air nozzle unit and an air driving unit in the claims.

The fourth driving unit 62 includes a fourth guide 64 and a fourth driving block 63.

The fourth guide 64 extends along the first through third guides 34 through 54 in parallel to the first through third guides 34 through 54.

The fourth driving block 63 may move along the fourth guide 64, and like the first through third driving blocks 33 through 53 described above, the fourth driving block 63 and fourth guide 64 may constitute a linear motor unit.

The fourth driving block 63 is connected to the air tank 65 and provides fluid cutting air via the fourth nozzle unit 61. Here, the fourth driving block 63 may include an air pump inside or outside the fourth driving block 63. Furthermore, the fourth driving block 63 is connected to the control unit 70 and controls ejection of fluid cutting air according to operation of the control unit 70. An opening/closing side for controlling flow of fluid cutting air may be arranged in the fourth driving block 63, and the opening/closing side may be operated by the control unit 70.

The fourth nozzle unit 61 is arranged as an ejection nozzle appropriate for ejecting fluid cutting air, and more preferably, an ejection nozzle for ejecting fluid cutting air curtain.

Although FIG. 18 shows that only one air supplying unit 60 is arranged, any of various numbers of the air supplying units 60 may be arranged according to mechanism design conditions, so that at least two of the first through third fluids are not mixed with each other. Furthermore, operation of the air supplying unit 60 does not interfere operations of the first through third fluid supplying units 30 through 50, and thus freedom of sequences of operating the air supplying unit 60 may be guaranteed.

The fourth driving unit 62 of the air supplying unit 60 for supplying fluid cutting air may be arranged separate from the first through third fluid supplying units 30 through 50 as shown in FIG. 18. However, the present invention is not limited thereto, and the fourth driving unit 62 may be integrated to at least one of first through third driving units 32 through 52. Here, the integration may be indicated that the fourth guide 62 is replaced with the second guide 44 as shown in FIG. 14.

Figure 19:
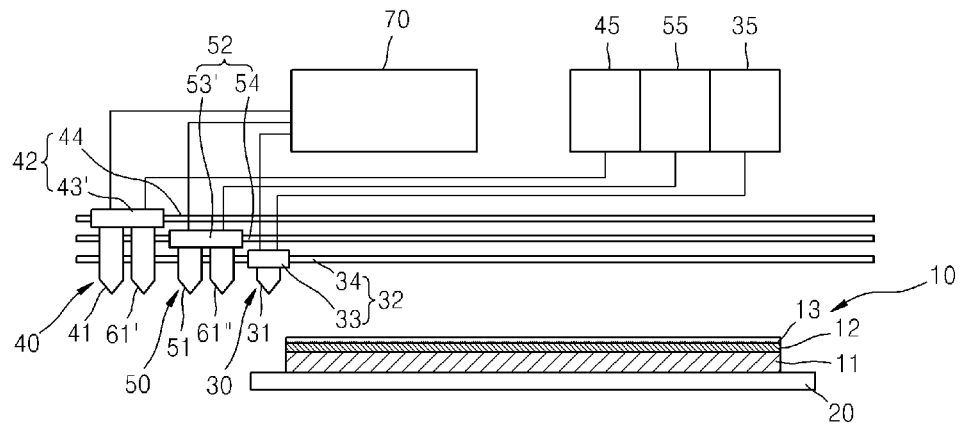
FIG. 19 is a schematic diagram showing configuration of a silicon substrate treating apparatus according to another embodiment of the present invention.

FIG. 19 shows that separate fourth nozzle units 61' and 61" are respectively connected to a second driving block 43' and a third driving block 53'. In FIG. 19, the fourth nozzle units 61' and 61" are respectively arranged in front of the second nozzle unit 41 and the third nozzle unit 51. However, the present invention is not limited thereto. Although not shown, the fourth nozzle units 61' and 61" may be selectively arranged behind the second nozzle unit 41 and the third nozzle unit 51, respectively. Alternatively, the fourth nozzle units 61' and 61" may be arranged in front of and behind the second nozzle unit 41 and the third nozzle unit 51, respectively. Furthermore, although FIG. 19 shows that the fourth nozzle units 61' and 61" are only installed on the second driving block 43' and the third driving block 53', the present invention is not limited thereto, and the fourth nozzle units 61' and 61" may also be installed on the first driving block 33.

In a structure in which the fourth nozzle units 61' and 61" are installed, insides of the second driving block 43' and the third driving block 53' may be partitioned into several portions and one of the portions functions as the fourth driving blocks. Therefore, opening/closing sides (not shown) and/or pressurizing pumps (not shown) that are connected to the fourth nozzle units 61' and 61" may be further installed in the second driving block 43' and the third driving block 53'. Furthermore, it is necessary for the second driving block 43' and the third driving block 53' to be connected to the air tank 65.

The timing diagram shown in FIGS. 8 through 11 may be applied to the embodiment shown in FIG. 19.

Figure 20:
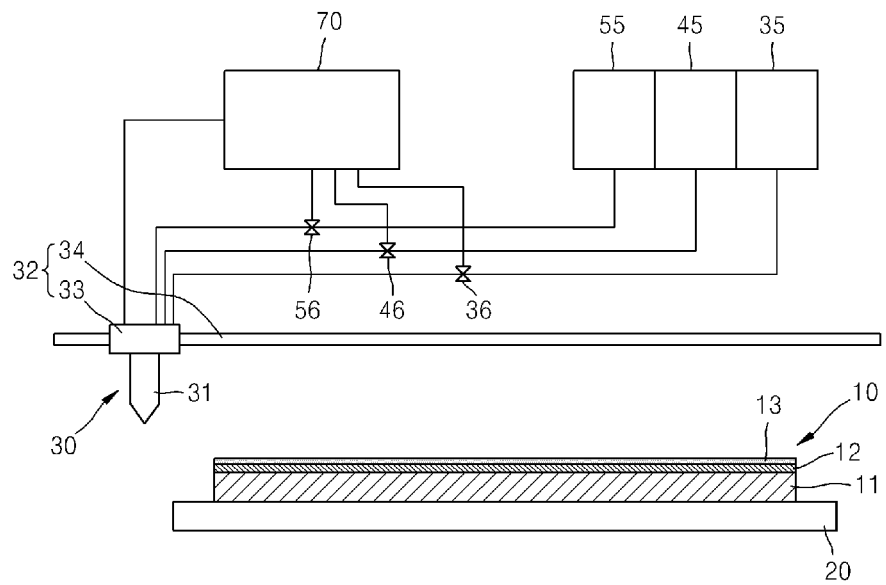
FIG. 20 is a schematic diagram showing configuration of a silicon substrate treating apparatus according to another embodiment of the present invention.

FIG. 20 is a schematic diagram showing a silicon substrate treating apparatus according to another embodiment of the present invention.

Referring to FIG. 20, a single fluid supplying unit 30 is arranged. The fluid supplying unit 30 is a unit for selectively providing the first through third fluids to a surface of the substrate 10 and includes the first nozzle unit 31 and the first driving unit 32. Furthermore, the first driving unit 32 includes the first driving block 33 and the first guide 34. Detailed descriptions thereof are as given above.

First through third opening/closing sides 36 through 56 may be interposed between and interconnect the first through third reservoirs 35 through 55 and the first driving block 33.

The first through third opening/closing sides 36 through 56 may be electronically connected to the control unit 70 and controlled by the control unit 70.

As described above, a silicon substrate treating apparatus may be configured more compactly by selectively providing the first through third fluid by using the single fluid supplying unit 30.

Figure 21:
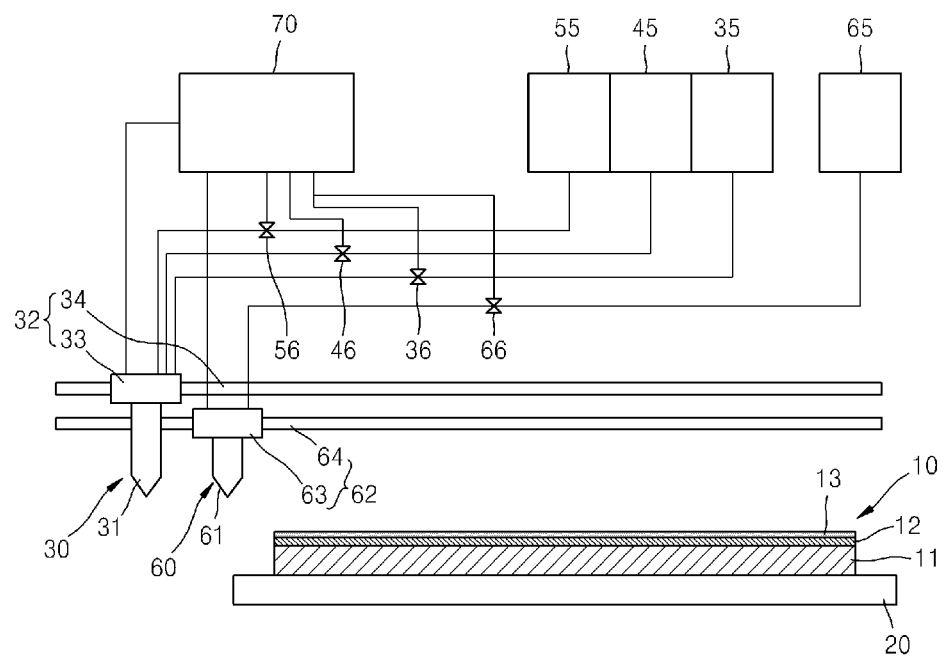
FIG. 21 is a schematic diagram showing configuration of a silicon substrate treating apparatus according to another embodiment of the present invention.

FIG. 21 shows a silicon substrate treating apparatus according to another embodiment of the present invention, which further includes the air supplying unit 60 connected to the control unit 70. Detailed description of the air supplying unit 60 is same as the description given above with reference to FIG. 18.

Figure 22:
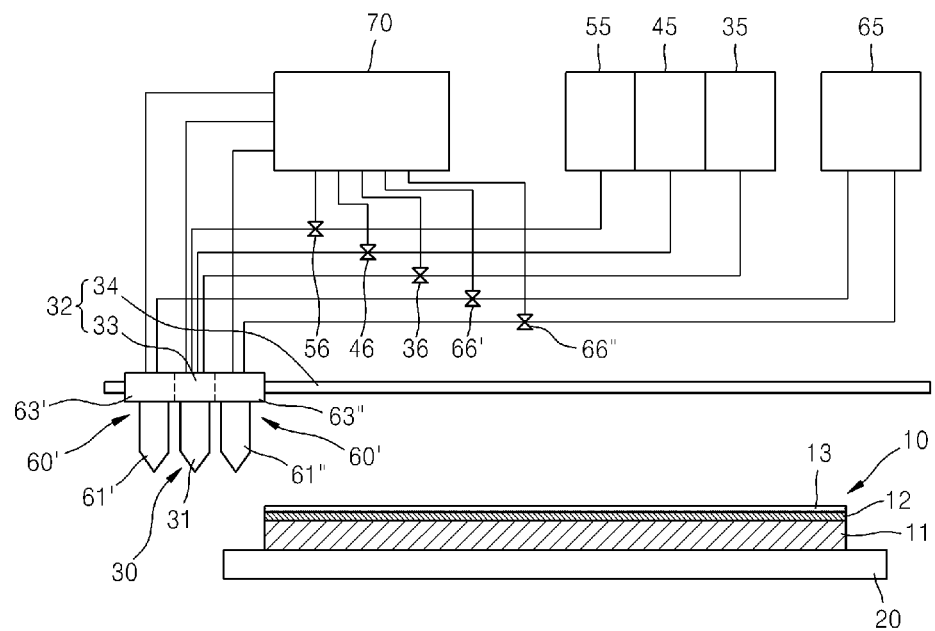
FIG. 22 is a schematic diagram showing configuration of a silicon substrate treating apparatus according to another embodiment of the present invention.

FIG. 22 shows a silicon substrate treating apparatus according to another embodiment of the present invention, in which fourth driving units of the air supplying unit 60' and 60" are integrated to a first driving unit of the fluid supplying unit 30.

In detail, the fourth driving blocks 63' and 63" of the air supplying unit 60' and 60" are integrated to the first driving block 33, and the first guide 34 is used as a guide for the air supplying unit 60' and 60". Furthermore, the fourth nozzles 61' and 61" are installed on each of the fourth driving blocks 63' and 63" integrated to the first driving block 33. It is not necessary to arrange separate moving units to the fourth driving blocks 63' and 63" for moving along the first guide 34, and only a configuration in which the fourth nozzles 61' and 61" are controlled by the control unit 70 will suffice.

Although FIG. 22 shows that the fourth driving blocks 63' and 63" and the fourth nozzle units 61' and 61" are arranged in front of and behind the first driving block 33 and the first nozzle unit 31, the present invention is not limited thereto. The fourth driving blocks 63' and 63" and the fourth nozzle units 61' and 61" may be arranged either in front of or behind the first driving block 33 and the first nozzle unit 31.

Figure 23:
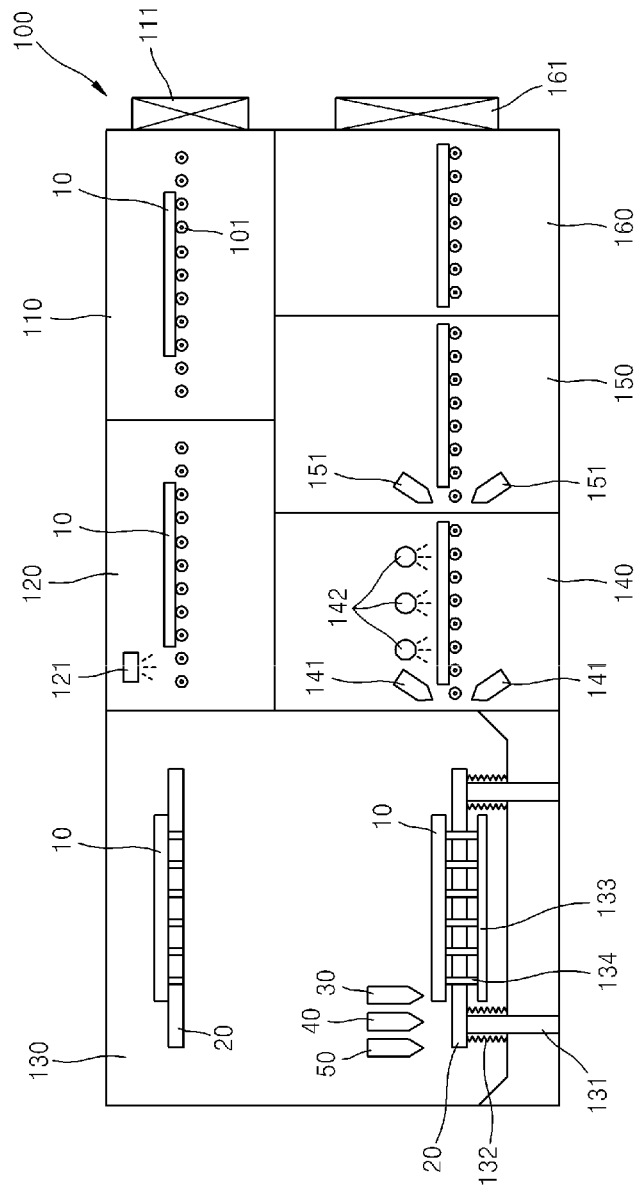
FIG. 23 is a schematic diagram showing a silicon substrate treating system according to an embodiment of the present invention.

FIG. 23 is a diagram showing a system 100 including the silicon substrate treating apparatus as described above.

The system 100 include first through sixth chambers 110 through 160, where a third chamber 130 becomes a main chamber in which an apparatus for etching a silicon oxide film formed on a silicon film is arranged. The system 100 may have a double stage structure, in which a first chamber 110 and a second chamber 120 are connected with each other to form an upper stage and fourth through sixth chambers 140 through 160 are connected with each other to form a lower stage, around the third chamber 130. The double stage structure may reduce the overall volume of the system 100, and thus the system 100 may be installed in a relatively narrow space.

The first chamber 110 and the second chamber 120 may be formed as a single chamber instead of two individual units, whereas the fourth through sixth chambers 160 may be formed as a single chamber. Therefore, the first chamber 110 and the second chamber 120 constitutes a loading unit in a broad sense, the third chamber 130 constitutes an etching unit, and the fourth through sixth chambers 140 through 160 constitutes an unloading unit in a broad sense.

An inlet 111 is formed in the first chamber 110, so that the substrate 10 is introduced therethrough. An outlet 161 is formed in the sixth chamber 160, so that the substrate 10 after treatment is ejected therefrom. A plurality of supporting rollers 101 are arranged in the first chamber 110, the second chamber 120, and the fourth through sixth chambers 140 through 160 to transfer the substrate 10. Although not shown, supporting rollers may also be arranged in the third chamber 130.

The first chamber 110 constitutes a loading chamber, into which the substrate 10 is loaded.

The second chamber 120 becomes a pre-humidifying chamber, includes a humidifying nozzle unit 121, and pre-humidifies a surface of the substrate 10.

A silicon substrate treating apparatus according to the present invention as described above is installed in the third chamber 130, where first through fourth position adjusting units 131 through 134 are arranged at the bottom of the third chamber 130 to adjust position of the substrate 10.

The first position adjusting unit 131 is arranged to support the supporting base 20 moved downward and may be elastically moved in a vertical direction by the second position adjusting unit 132, and thus horizontality of the supporting base 20 may be maintained.

The fourth position adjusting units 134, which has a shape of a plurality of pins, is arranged on the third position adjusting unit 133 for pushing the supporting base 20 supported by the first position adjusting unit 131 upward, so that the fourth position adjusting unit 134 directly supports the substrate 10. A plurality of driving rollers may be installed on the supporting base 20 to transfer the substrate 10, and the fourth position adjusting unit 134 may be inserted between the driving rollers.

When the substrate 10 that is pre-humidified by the second chamber 120 is transferred to the third chamber 130, the supporting base 20 supports the substrate 10.

Here, the supporting base 20 moves downward and lands on the first position adjusting unit 131. Next, the first position adjusting unit 131, which has received an elastic force from the second position adjusting unit 132, maintains horizontality of the supporting base 20.

Next, as the third position adjusting unit 133 moves upward, the fourth position adjusting unit 134 passes by the supporting base 20 and pushes the substrate 10 upward. Here, the substrate 10 may be supported only by the supporting base 20 without using the fourth position adjusting unit 134.

Next, the first through third fluid supplying units 30 through 50 performs the treatments described above. Although the air supplying unit 60 is not shown, the air supplying unit 60 may also perform the treatment described above.

After a surface of the substrate 10 is treated by using the first through third fluids, the substrate 10 is transferred to the fourth chamber 140.

The fourth chamber 140 is a rinsing zone. A fluid cutting air curtain supplying unit 141 is arranged at the inlet of the fourth chamber 140, whereas a plurality of rinse nozzle units 142 are arranged behind the fluid cutting air curtain supplying unit 141 for rinsing the surface of the substrate 10. The air curtain supplying unit 141 is a unit for removing at least one of the first through third fluids remaining on the surface of the substrate 10 by using air pressure.

Next, the substrate 10 is transferred to the fifth chamber 150, where the fifth chamber 150 is a drying zone. An air knife supplying unit 151 is arranged in the fifth chamber 150 to dry the front surface and the rear surface of the substrate 10.

The sixth chamber 160 is an unloading unit, where the substrate 10 ejected via the outlet 161 is carried to outside by a transferring robot (not shown).

The system may be operated as an individual equipment, which does not include operation of the transferring robot, in the system 100.

The system 100 is an example of employing a silicon substrate treating apparatus according to the present invention, and a silicon substrate treating apparatus according to the present invention may be applied to various types of systems.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of treating a substrate including a base substrate, a silicon film on the base substrate and a silicon oxide film on the silicon film, the method comprising:
providing a first nozzle unit configured to supply a first fluid, which is a first etchant for etching the silicon oxide film, to a surface of the substrate;
scanning the first nozzle unit linearly and supplying the first fluid to the surface of the substrate through the first nozzle unit from one end of the substrate to opposite end of the substrate in a first time period; and
providing a second nozzle unit configured to supply a second fluid, which is a second etchant for etching the silicon oxide film, has different ingredients as compared to the first fluid, and has higher etching rate with respect to the silicon oxide film than that of the first fluid, to the surface of the substrate;
scanning the second nozzle unit linearly and supplying the second fluid to the surface of the substrate through the second nozzle unit from said one end of the substrate to said opposite end of the substrate in a second time period, which is different from the first time period;
providing a third nozzle unit configured to supply a third fluid containing water to the surface of the substrate; and
scanning the third nozzle unit linearly and supplying the third fluid to the surface of the substrate through the third nozzle unit from said one end of the substrate to said opposite end of the substrate in a third time period, which is different from the first and second time periods,
wherein the first through third time periods overlap at least partially each others.

2. The method of claim 1, wherein the third time period is arranged between the first time period and the second time period.

3. The method of claim 1, wherein the substrate is arranged in parallel to the ground or is tilted with respect to the ground.

4. The method of claim 1, wherein the first through third time periods are arranged to have different start timings.

5. The method of claim 1, wherein air is provided to the surface of the substrate to remove at least one of the first through third fluids remaining on the surface of the substrate, and
the air is provided to the surface of the substrate in a fourth time period, which is different from the first through third time periods and is arranged between at least two of the first through third time periods.

6. A method of treating a substrate including a base substrate, a silicon film on the base substrate and a silicon oxide film on the silicon film, the method comprising:
providing a first nozzle unit configured to supply a fluid, which is an etchant for etching the silicon oxide film, to a surface of the substrate;
scanning the first nozzle unit linearly and supplying the fluid to the surface of the substrate through the first nozzle unit from one end of the substrate to opposite end of the substrate in a first time period;
providing a second nozzle unit configured to supply water to the surface of the substrate;
scanning the second nozzle unit linearly and supplying the water to the surface of the substrate through the second nozzle unit from said one end of the substrate to said opposite end of the substrate in a second time period, which is different from the first time period;
providing a third nozzle unit configured to supply air to the surface of the substrate to remove at least one of the fluid and the water remaining on the surface of the substrate; and
scanning the third nozzle unit linearly and supplying the air to the surface of the substrate through the third nozzle unit from said one end of the substrate to said opposite end of the substrate in a third time period, which is different from the first and second time periods,
wherein the third time period overlaps with at least one of the first and second time periods at least partially, and is arranged to have a different start timing from the first and second time periods.

* * * * *